(12) United States Patent
Krug et al.

(10) Patent No.: US 11,901,883 B2
(45) Date of Patent: Feb. 13, 2024

(54) DIAGNOSIS OF GATE VOLTAGE TO DETECT HIGH CURRENT

(71) Applicant: Infineon Technologies AG, Neubiberg (DE)

(72) Inventors: Michael Krug, Munich (DE); Marco Bachhuber, Neuried (DE); Marcus Nuebling, Olching-Esting (DE); Tomas Manuel Reiter, Munich (DE)

(73) Assignee: Infineon Technologies AG, Neubiberg (DE)

( * ) Notice: Subject to any disclaimer, the term of this patent is extended or adjusted under 35 U.S.C. 154(b) by 100 days.

(21) Appl. No.: 17/456,857

(22) Filed: Nov. 29, 2021

(65) Prior Publication Data

US 2023/0170892 A1    Jun. 1, 2023

(51) Int. Cl.
*H03K 17/0812*    (2006.01)
*H03K 17/18*    (2006.01)

(52) U.S. Cl.
CPC ....... *H03K 17/08122* (2013.01); *H03K 17/18* (2013.01); *H03K 2217/0027* (2013.01)

(58) Field of Classification Search
CPC ............. H03K 17/08122; H03K 17/18; H03K 2217/0027
USPC ......................................................... 361/93.1
See application file for complete search history.

(56) References Cited

U.S. PATENT DOCUMENTS

| | | | | |
|---|---|---|---|---|
| 5,416,689 A * | 5/1995 | Silverstein | ........... | H02H 7/1227 363/21.16 |
| 9,673,809 B1 * | 6/2017 | Kandah | ................... | H02P 27/08 |
| 2008/0012542 A1 * | 1/2008 | Liu | ........................ | H02M 1/32 323/271 |
| 2014/0092655 A1 * | 4/2014 | Igarashi | ................. | H02H 7/122 363/56.05 |
| 2017/0070142 A1 * | 3/2017 | Sundararaj | ............ | H02M 3/156 |

(Continued)

OTHER PUBLICATIONS

F. Zhang, X. Yang, Y. Ren, L. Feng, W. Chen and Y. Pei, "Advanced Active Gate Drive for Switching Performance Improvement and Overvoltage Protection of High-Power IGBTs," in IEEE Transactions on Power Electronics, vol. 33, No. 5, pp. 3802-3815, May 2018, doi: 10.1109/TPEL.2017.2716370 (Year: 2018).*

(Continued)

*Primary Examiner* — Thienvu V Tran
*Assistant Examiner* — Sreeya Sreevatsa
(74) *Attorney, Agent, or Firm* — Shumaker & Sieffert, P.A.

(57) ABSTRACT

Overload detection and protection for power switch circuits. For circuits with faster switching speed, fast fault detection and response to a detected overload condition may be desirable. Detection circuitry may monitor a voltage on the control terminal of one or more power switches. Based on empirical measurements, in an overload condition of a power switch circuit, e.g., a half-bridge circuit, the voltage at the control terminal may increase, and in some examples, increase to a magnitude that is greater than a supply voltage. A comparator may detect a voltage increase that exceeds a voltage magnitude threshold, output an indication to control circuitry for the power switch circuit, and the control circuitry may take action to protect the rest of the circuitry, such as reduce voltage or shut off the power switch circuit.

20 Claims, 5 Drawing Sheets

(56) References Cited

U.S. PATENT DOCUMENTS

2018/0351353 A1* 12/2018 Mazoyer ............. H01L 27/0288
2020/0021284 A1* 1/2020 Thalheim ........... H03K 17/0822

OTHER PUBLICATIONS

"Understanding the Short Circuit Protection for Silicon Carbide MOSFETs", Texas Instruments, Retrieved from: https://www.ti.com/lit/an/slua863b/slua863b.pdf?ts=1632563437013, Revised May 2020, 3 pp.
Huang, "Hard Commutation of Power MOSFET OptiMOS™ FD 200V/250V", Infineon Technologies Austria AG, Mar. 12, 2014, 13 pp.
Merello, "Short-Circuit Protection for Power Inverters", International Rectifier, Retrieved from: http://www.irf.com/technical-info/designnote/dn500.pdf, Accessed on Sep. 25, 2021, 2 pp.
Stasi, "Know Your Limits", Application Report SNVA736, Texas Instruments, May 2016, 16 pp.

\* cited by examiner

DIAGNOSIS OF GATE VOLTAGE TO DETECT HIGH CURRENT

TECHNICAL FIELD

This disclosure relates to power switches, and more specifically, techniques and circuits for protecting power switch circuits from different problems that can occur.

BACKGROUND

Power switches are used in a wide variety of applications to control power being delivered to a load. As examples, a power switch may comprise a Field Effect Transistor (FET), a bipolar junction transistor (BJT), a gallium nitride (GaN) switch, or a silicon carbide (SiC) switch, or possibly a silicon-controlled rectifier (SCR). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. MOSFETs may be formed in silicon, gallium nitride, silicon carbide, or other materials. Examples of BJTs may include, but are not limited to, PNP, NPN, heterojunction, or any other type of BJT, or any combination of the same.

Power switches are typically controlled by a driver circuit via a modulation control signal, such as pulse width modulation (PWM), pulse frequency modulation (PFM), pulse duration modulation, pulse density modulation, or another type of modulation control signal. Modulation control signals can be applied to the control terminal, e.g., a gate, of a power switch to control on/off switching of the power switch, and thereby control the average amount of power delivered through the power switch to a load. The on/off switching of the power switch effectively chops power delivery into discrete parts. The average value of voltage and/or current fed to a load can be controlled by turning the switch on and off at a fast rate. The longer the switch is on compared to the off periods, the higher the total power supplied to the load. In many applications, two different power switches are configured in a high-side and low-side configuration, and the on/off switching of the two power switches is synchronized in order to deliver the desired power to a switch node positioned between the high-side and low-side switch.

SUMMARY

In general, the disclosure describes overload detection and protection for power switch circuits. In some examples, power switch circuits may operate more efficiently by increasing the switching speed of the power switches. For circuits with faster switching speed, fast overload detection and response to a detected overload condition may be desirable, such as for safety and improved efficiency. The detection circuitry of this disclosure may monitor a voltage on the control terminal of one or more power switches in relation to a supply voltage of the switching circuit. In some examples, the circuit arrangement of this disclosure may provide fast overload detection by leveraging electrostatic discharge (ESD) protection components to detect a voltage change at the control terminal of the power switch. Based on empirical measurements, in an overload condition of a power switch circuit, e.g., a half-bridge circuit, the voltage at the control terminal may increase, and in some examples, increase to a magnitude that is greater than a supply voltage for the power switch circuit. The circuit arrangement of this disclosure may detect this increase in voltage magnitude at the control terminal, e.g., the gate, of the power transistor. In one example arrangement, a comparator may detect a voltage increase across an ESD diode that exceeds a voltage threshold, output an indication to control circuitry for the power switch circuit, and the control circuitry may take action to protect the rest of the circuitry, such as reduce voltage or shut off the power switch circuit.

In one example, this disclosure describes a driver circuit configured to control a power switch, the driver circuit comprising an output pin, wherein the driver circuit is configured to deliver drive signals from the output pin to a control terminal of the power switch to control ON/OFF switching of the power switch, a voltage detection circuit, configured to detect a voltage overshoot on the control terminal of the power switch, and protection logic circuitry configured to: receive an indication from the voltage detection circuit that the voltage overshoot satisfies a voltage threshold, determine, based on the received indication that an overload condition exists, and in response to determining that the overload condition exists, adjust the drive signal delivered via the output pin to change operation of the power switch.

In another example, this disclosure describes a system comprising a load, a power switch that includes a transistor, wherein the power switch is configured to control power delivered to the load, and a driver circuit configured to control the power switch, the driver circuit includes an output pin, wherein the driver circuit is configured to deliver drive signals from the output pin to a control terminal of the power switch to control ON/OFF switching of the power switch, and a voltage detection circuit, configured to detect a voltage overshoot on the control terminal of the power switch, and protection circuitry, configured to: receive an indication from the voltage detection circuit that the voltage overshoot satisfies a voltage threshold, determine, based on the received indication that condition exists, and in response to determining that the condition exists, adjust the drive signal delivered via the output pin to change operation of the power switch.

In another example, this disclosure describes a method of controlling a power switch comprising delivering drive signals from an output pin of a driver circuit to a gate of the power switch to control ON/OFF switching of the power switch, receiving an indication from a voltage detection circuit of a value of voltage at the gate of the power switch, determining whether a voltage overshoot is present based on the value of the voltage at the gate of the power switch, determining whether the voltage overshoot satisfies a voltage threshold, determining whether an overload condition is present based on the voltage overshoot satisfying a voltage threshold, in response to determining that the overload condition is present, adjusting the drive signal delivered via the output pin to adjust an operation of the power switch.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
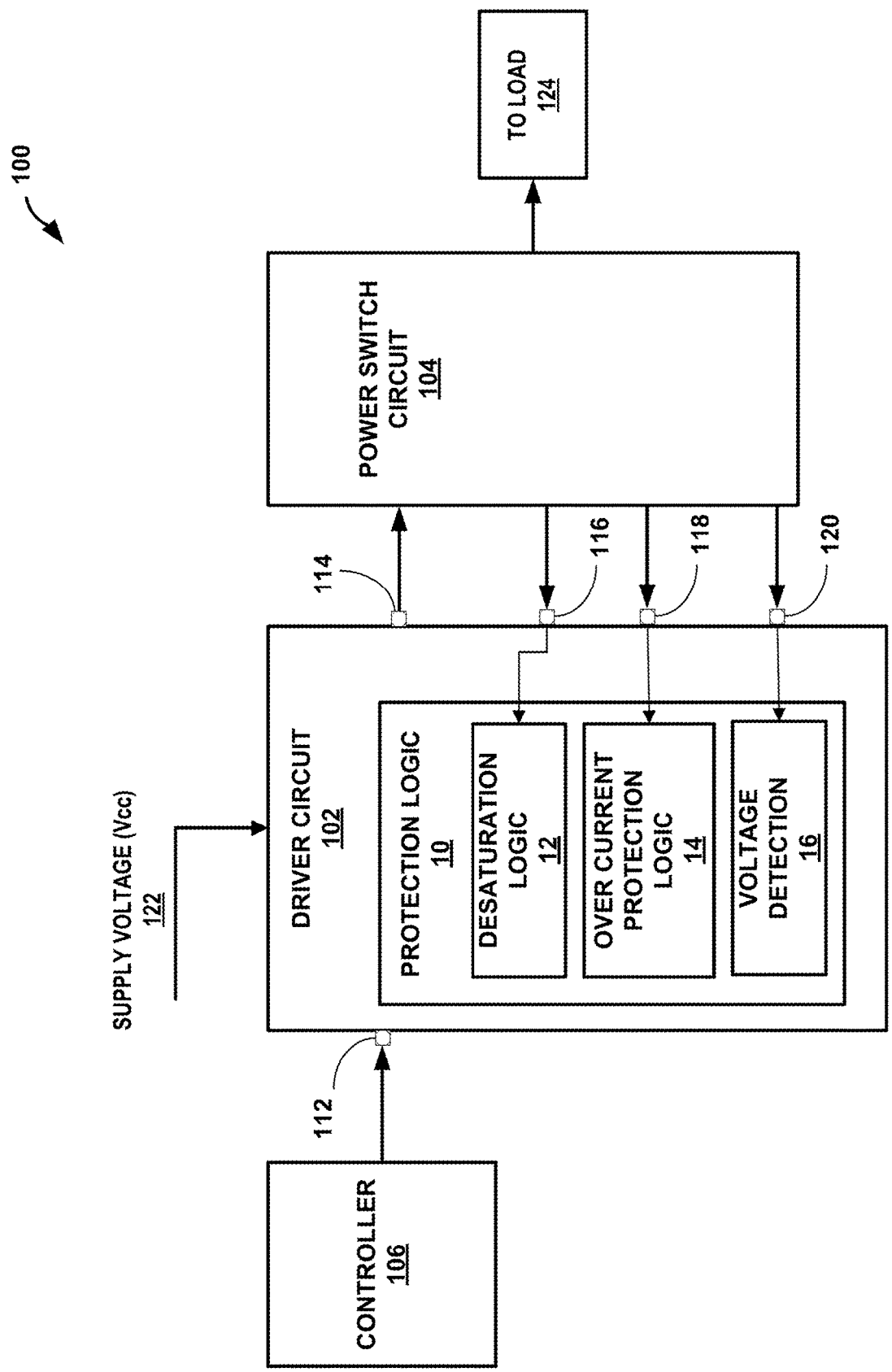
FIG. 1 is a block diagram of an example system that includes a power switch circuit, a driver circuit, and a controller.

This disclosure describes circuitry and monitoring techniques to protect power switch circuits. In some examples, power switch circuits may operate more efficiently by increasing the switching speed of the power switches, when compared to a lower switching speed. Fast detection and fast response to circuit faults, such as overload detection may be desirable for circuits with faster switching speed for safety and circuit protection. The detection circuitry of this disclosure may monitor a voltage on the control terminal of one or more power switches in relation to a supply voltage of the switching circuit. In some examples, the circuit arrangement of this disclosure may provide fast fault detection by leveraging electrostatic discharge (ESD) protection components to detect a voltage change at the control terminal of the power switch. A fault such as an overload condition may refer to a circuit condition where the circuit may carry higher than normal electrical current. A short circuit may cause such an overload condition. In this disclosure a "short circuit" may refer to a situation in which the current through the power switch is at a high enough level that the power switch limits the amount of current, even when switched on.

Based on empirical measurements, in an overload condition of a power switch circuit, e.g., a half-bridge circuit, the voltage at the control terminal may increase, and in some examples, increase to an absolute value that is greater than a supply voltage for the power switch circuit. The circuit arrangement of this disclosure may detect this increase in voltage magnitude at the control terminal, e.g., the gate, of the power transistor. Monitoring circuitry, such as a processor, logic circuitry and so on, may respond to the detected circuit malfunction to reduce power or in some examples, shut down the switching circuit.

In this manner the circuitry of this disclosure may provide overload condition detection and response that is faster than other overload detection techniques, which may result in improved safety and higher efficiency power switch circuitry when compared to other the circuit arrangements. For example, a circuit with slower response to an overload may be implemented with power semiconductors that are rated to withstand high current for at least as long as the response time of the overload detection features. An overload condition, in this disclosure is a condition in which circuit components may be subject to high current, e.g., higher than expected current that may degrade or damage circuit components. However, characteristics of power semiconductors that allow the semiconductor components to withstand higher currents may also decrease the efficiency of the semiconductor components. In this manner, the techniques of this disclosure, by detecting and reacting to the overload faster than other comparable techniques, such as desaturation protection or overcurrent protection (OCP), may also allow for circuit implementation with higher efficiency components.

FIG. 1 is a block diagram of an example system 100 that includes a power switch circuit 104, a driver circuit 102, and a controller 106. Controller 106 may comprise a microprocessor or other processing circuitry configured to control driver circuit 102. In particular, controller 106 sends command signals to driver circuit 102 via input pin 112. Based on these command signals, driver circuit 102 sends ON/OFF signals (e.g., gate control signals) to power switch circuit 104 to turn one or more power switches of power switch circuit 104 ON or OFF.

Driver circuit 102 may control power switch circuit 104 via modulation signals on output pin 114, which may control the ON/OFF switching of a power switch, such as a transistor, within power switch circuit 104. The modulation signals, for example, may comprise pulse width modulation (PWM) signals, pulse frequency modulation (PFM) signals, pulse duration modulation signals, pulse density modulation signal, or another type of modulation control signal use to control a power transistor. In normal operation, the signals from driver circuit 102 over output pin 114 can be applied to the gate (or other control terminal) of a power switch within power switch circuit 104 to control on/off switching of the power switch, and thereby control the average amount of power delivered through the power switch to a load (not shown in FIG. 1). In the most general sense, driver circuit 102 may comprise any type of driver for any type of power switch, e.g., a high-side switch driver, a low-side switch driver, a driver within a flyback power converter, or any driver used in any circuit arrangement that controls ON/OFF switching of one or more power switches.

Power switch circuit 104 may comprise one or more power transistors. In the example of FIG. 1, a power transistor within power switch circuit 104 may comprise an insulated gate bipolar transistor (IGBT), or a MOSFET. The MOSFET may be formed in silicon, in which case the MOSFET may be called a silicon MOSFET. Alternatively, the MOSFET may be formed in another semiconductor material, such as silicon carbide (SiC) or gallium nitride (GaN), in which case the MOSFET may be called a SiC MOSFET or a GaN MOSFET.

According to this disclosure, driver circuit 102 includes protection logic 10 connected to power switch circuit 104 through one or more terminals, also referred to as pins in this disclosure. In some examples, power switch circuit 104 may be used to switch currents in the range of several hundred amperes. Protection circuitry, such as protection logic 10 may be desirable for such power switch circuits. In the example of FIG. 1, protection logic 10 connects to detection pins 116, 118 and 120. In other examples, (not shown in FIG. 1), protection logic 10 may connect to more detection pins or fewer detection pins. In other examples, a single detection pin may perform more than one detection function described in this disclosure.

In some examples, protection logic 10 may be implemented using logic circuit components such as comparators, AND gates, NOR gates, or other logic components. In other examples, protection logic 10 may be implemented using one or more processors. In other examples, protection logic 10 may be implemented with analog components. In some examples protection logic 10 may be implemented using any combination of analog components, logic components and processing circuitry. Therefore, in this disclosure, protection logic 10 may also be described as protection logic circuitry or protection circuitry.

In the example of FIG. 1, detection pin 116 connects to desaturation (DESAT) logic 12, and may be referred to as DESAT pin 116. Similarly, detection pin 118 connects to over current protection (OCP) logic 14 and may be referred to as OCP pin 118. Gate voltage detection 16 connects to power switch circuit 104 at detection pin 120. As noted above, protection logic 10 may also include additional detection or protection features, such as safe operating area (SOA) detection, and other functions not shown in FIG. 1.

In some examples, DESAT logic 12 may provide desaturation protection by receiving an indication of the voltage on the collector/emitter (or drain/source in the example of a FET power switch) of the current carrying channel of the power switch. In other words, DESAT logic 12 may be configured to monitor Vce across IGBT/SiC transistor of power switch circuity 104 (not shown in FIG. 1). DESAT logic 12 may compare the measured voltage internally with a reference voltage. If the absolute value of the voltage, Vce, gets too large as current through the power switch gets too large DESAT logic 12 may be configured to switch power switch circuit 104 off. Some disadvantages of desaturation protection for fast switching circuits may include long blanking times and a tradeoff between fast reaction and avoiding false failures, an additional high voltage diode may be used to prevent high voltage in the circuit and DESAT logic 12 may also use external filter capacitors with high tolerances.

OCP logic 14 may refer to the monitoring of voltage on a dedicated power module pin, e.g., detection pin 118. Some examples of power modules may provide scaled down current information on the dedicated OCP pin 118. For overcurrent protection, OCP logic 14 may receive an indication of the current through few cells of a power switch of power switch circuit 104 as measured via an indirect measurement with a shunt resistor (not shown in FIG. 1). In some examples OCP protection may include additional structure on the power semiconductor, such as the additional shunt resistor on the PCB to measure the high current. Similar to DESAT logic 12, OCP logic 14 may be configured to disable the power switch in response to detecting that one or more power switches within power switch circuit 104 is operating in the overcurrent state.

Protection logic 10 may also include gate voltage detection circuitry 16. In some examples, protection provided by gate voltage detection circuitry 16 may be desirable, especially for fast switching circuitry, e.g., in which the slew rate (di/dt) of the signal through the power switches may be greater than 5000 amps/microsecond (5 kA/μsec), which may include 8 kA/μsec, 10 kA/μsec, 20 kA/μsec and so on. Voltage detection circuitry 16 may detect a voltage overshoot on the control terminal of a power switch of power switch circuit 104. As noted above, for an overload condition on some types of power switches, such as FET, IGBT, and other insulated gate-oxide type control terminals, the voltage on the gate may overshoot the voltage applied to the gate by driver circuit 102. In some examples, the gate voltage overshoot may exceed supply voltage 122 to driver circuit 102 in an overload condition. The voltage overshoot on the power switch gate may occur much quicker than the reaction time for DESAT logic 12 or OCP 14. Therefore, in some examples, voltage detection circuit 16 may provide protection logic 10 and/or driver circuit 102, as well as controller 106, with a fast response time to indicate an overload condition, which may be desirable for fast switching circuitry. In some examples, the protection logic circuitry and voltage detection circuit 16 may be considered the same circuit.

In some examples, voltage detection circuitry 16 may receive an indication of the voltage at the control terminal of the power switch, e.g., the gate of a FET or IGBT. Voltage detection circuitry 16 may compare the measured voltage to a voltage threshold, such as to supply voltage 122 for power switch circuit 104, or to some other voltage threshold. Protection logic circuitry 10 may receive an indication from voltage detection circuit 16 that the measured voltage has a voltage overshoot that satisfies the predetermined voltage threshold. In some examples, protection logic 10 may determine, based on the received indication that the voltage on the control terminal satisfied the threshold, that an overload condition exists for power switch circuit 104, for example, a short circuit at load 124. In some examples, load 124 may be a low inductive load, but in other examples load 124 may be any type of load. In response to determining that the overload condition exists, driver circuit 102 may adjust the drive signal delivered via output pin 114 to change operation of power switch 104.

In some examples, driver circuit 102 may cause power switch circuit 104 to shut off all power output. In the example in which load 124 is a three-phase device, such as a motor, driver circuit 102 may control the switches in power switch circuit 104 to an active short circuit (ASC) state. An active short circuit for a three-phase-motor-drive application is a "safe state" were all three high side switches are turned on, or equivalently all three low side switches are turned on.

In some examples, the indication from voltage detection circuit 16 that the voltage overshoot satisfies a voltage threshold is a first indication to driver circuit 102 and/or controller 106. In some examples, the control logic of protection logic 10 may confirm the overload condition indicated by voltage detection circuitry 16 by receiving a second indication from one or more additional protection circuits that a fault condition exists at the power switch. The other protection circuits, e.g., DESAT logic 12, OCP 14, SOA and so on may be separate from voltage detection circuit 16. Any one or more of protection circuit 10, driver circuit 102 and controller 106 may, in response to receiving the second indication, determine that the overload condition exists. In some examples, controller 106 may be implemented as a controller of a system, such as a vehicle engine control unit (ECU), body control module (BCM) or similar processing circuitry.

Figure 2:
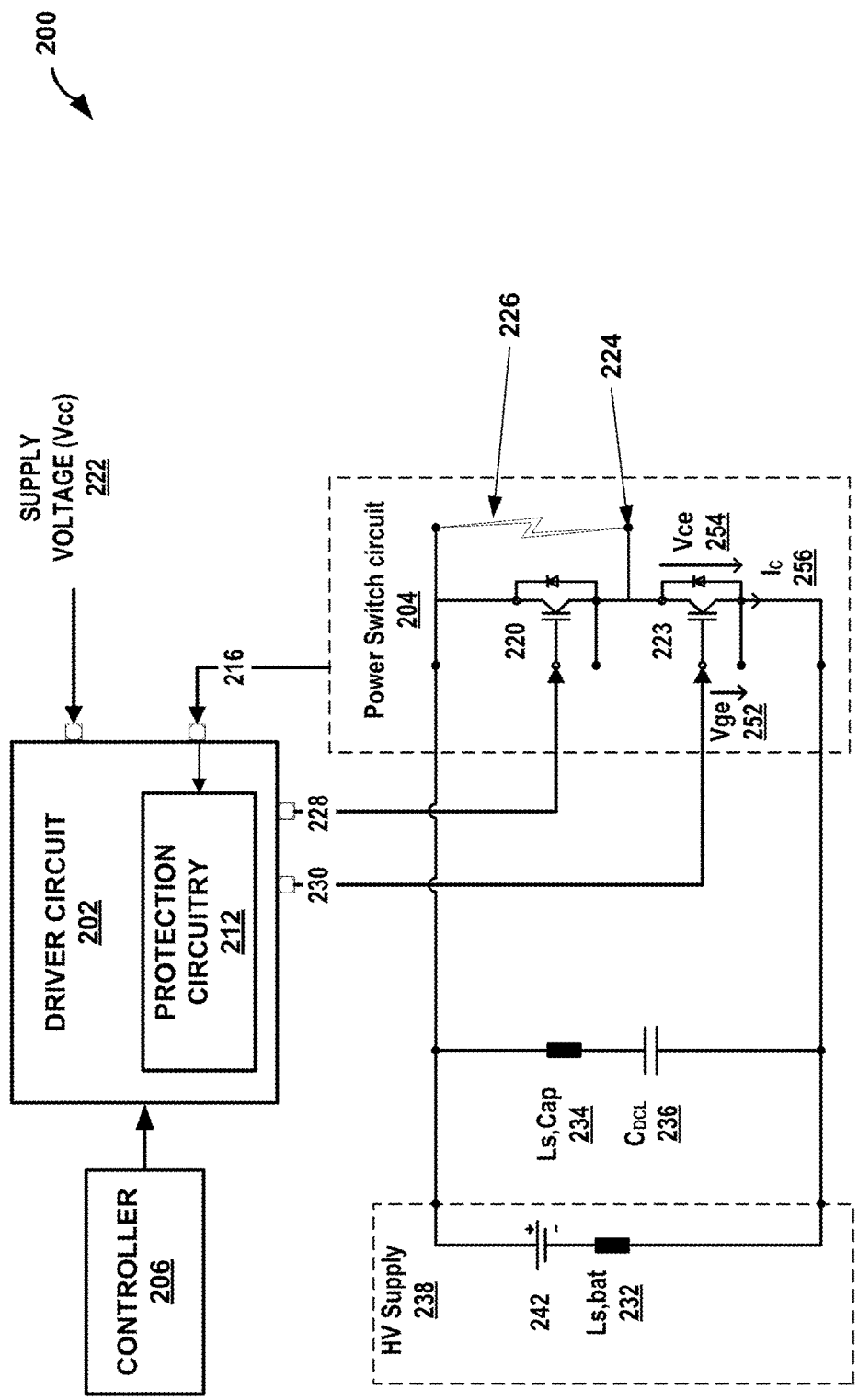
FIG. 2 is a block diagram illustrating of an example system with a power switch circuit and overload detection and response circuitry according to one or more techniques of this disclosure.

FIG. 2 is a block diagram illustrating of an example system with a power switch circuit and overload detection and response circuitry according to one or more techniques of this disclosure. System 200 of FIG. 2 is an example of system 100 described above in relation to FIG. 1. Similarly, controller 206, driver circuit 202 with protection circuits 212 and power switch circuit 204 are examples, respectively of controller 106, driver circuit 202 with protection logic 10, and power switch circuit 104, and may have the same functions and characteristics as described above in relation to FIG. 1. Protection circuitry 212 may include a gate voltage detection circuit such as voltage detection circuitry 16, as well as logic circuitry and other protection circuitry such as DESAT, OCP, SOA and so on.

As described above in relation to FIG. 1, controller 206 may comprise a microprocessor or other processing circuitry configured to control driver circuit 202. Based on these command signals, driver circuit 202 sends gate control signals to power switch circuit 204 to turn transistor 220 and transistor 223 of power switch circuit 204 ON or OFF. Power switch circuit 204 may be configured to deliver power to a load (not shown in FIG. 2). Driver circuit 202 may receive a supply voltage at Vcc pin 222, which may provide power to drive the gates of transistors 220 and 223 via pins 230 and 228, respectively. Protection circuitry 212 may receive indications and measurements from power switch circuit 204 via detection pin 216. For example, protection circuitry 212 may receive an indication of the value of the gate voltage, Vge 252 of transistor 223, as well as an indication of the Vce 254, current Ic 256 through transistor 223, temperature of power switch 204 and so on.

Power switch circuit 204 may be part of a power converter such as an AC-DC or DC-DC power converter, as shown in FIG. 2. In the example of system 200, HV supply 238 may include DC source 242, with a modeled series inductance Ls, bat 232. System 200 may also include capacitor Cdcl 236, with modeled series inductance Ls, Cap 234. The positive terminal of DC source 242 connects to the collector of high side transistor 220 and to a first terminal of Cdcl 236 through Ls, Cap 234. The negative terminal of DC source 242 connects to the emitter of transistor 223 through Ls, bat 232, as well as to a second terminal of Cdcl 236. The emitter of transistor 220 connects to the collector of transistor 223 at switch node 224. Though shown as a half-bridge circuit in the example of FIG. 2, the techniques of this disclosure may apply equally to other arrangements of power switch circuits, such as multiple half-bridge circuits, e.g., to drive a three-phase load, and other types of switching circuits. In the example of FIG. 2, transistors 220 and 223 are shown as insulated gate bipolar transistors (IGBT). In other examples, transistors 220 and 223 may be implemented as power MOSFETs or other types of electronic switches, for example as a silicon metal oxide semiconductor field effect transistor (MOSFET), a silicon carbide (SiC) MOSFET, or a gallium nitride (GaN) MOSFET.

In the event of fault in system 200, e.g., an overload condition such as a short circuit 226, electrical current Ic 256 may increase enough to degrade or damage components of system 200. By empirical measurements, gate voltage of transistor 223, Vge 252 may overshoot the applied driving voltage from output pin 230 of driver circuit 202. Voltage detection circuitry of protection circuit 212, may detect the voltage overshoot on the control terminal of the power switch, Vge 252, via detection pin 216. Protection logic circuitry, e.g., protection circuit 212, may be configured to compare the indication of gate voltage Vge 252 to a threshold. In some examples the threshold value may be the voltage at Vcc 222. The voltage detection circuit of protection circuitry 212 may determine that the voltage overshoot satisfies a voltage threshold. In this disclosure, to "satisfy" the voltage threshold, the measured voltage overshoot may exceed the threshold, e.g., be more positive than the threshold. In other examples, such as when driver circuit outputs a negative drive signal, then the voltage overshoot may be more negative than the threshold to satisfy the threshold. In other words, the absolute value of the overshoot may exceed a threshold voltage value to satisfy the threshold.

In some examples, protection circuit 212, driver circuit 202 and/or controller 206 may determine, based on the received indication that an overload condition exists. In response to determining that the overload condition exists, driver circuit 202 may adjust the drive signal delivered via output pins 228 and 230 to change operation of the transistors of power switch circuit 204. As described above in relation to FIG. 1, in some examples, driver circuit 202 may adjust the drive signal to output a drive signal that shuts off one or both power switches 220 and 223. In some examples, the determination of the overshoot condition and control output signal may be located at controller 206. In other examples, the protection circuitry of driver circuit 202 may determine whether an overshoot condition occurs and driver circuit 202 controls power switch 204 without waiting for a command from controller 206. In some examples, protection circuit 212 may output an indication to controller 206, which may execute programming instructions to take other actions within system 200 (not shown in FIG. 2). In some examples, controller 206 may control one or more functions of a vehicle, or other system based on the indication of the overload condition, e.g., send an alert message, light a warning light, shut down or activate one or more other components, and so on.

Figure 3:
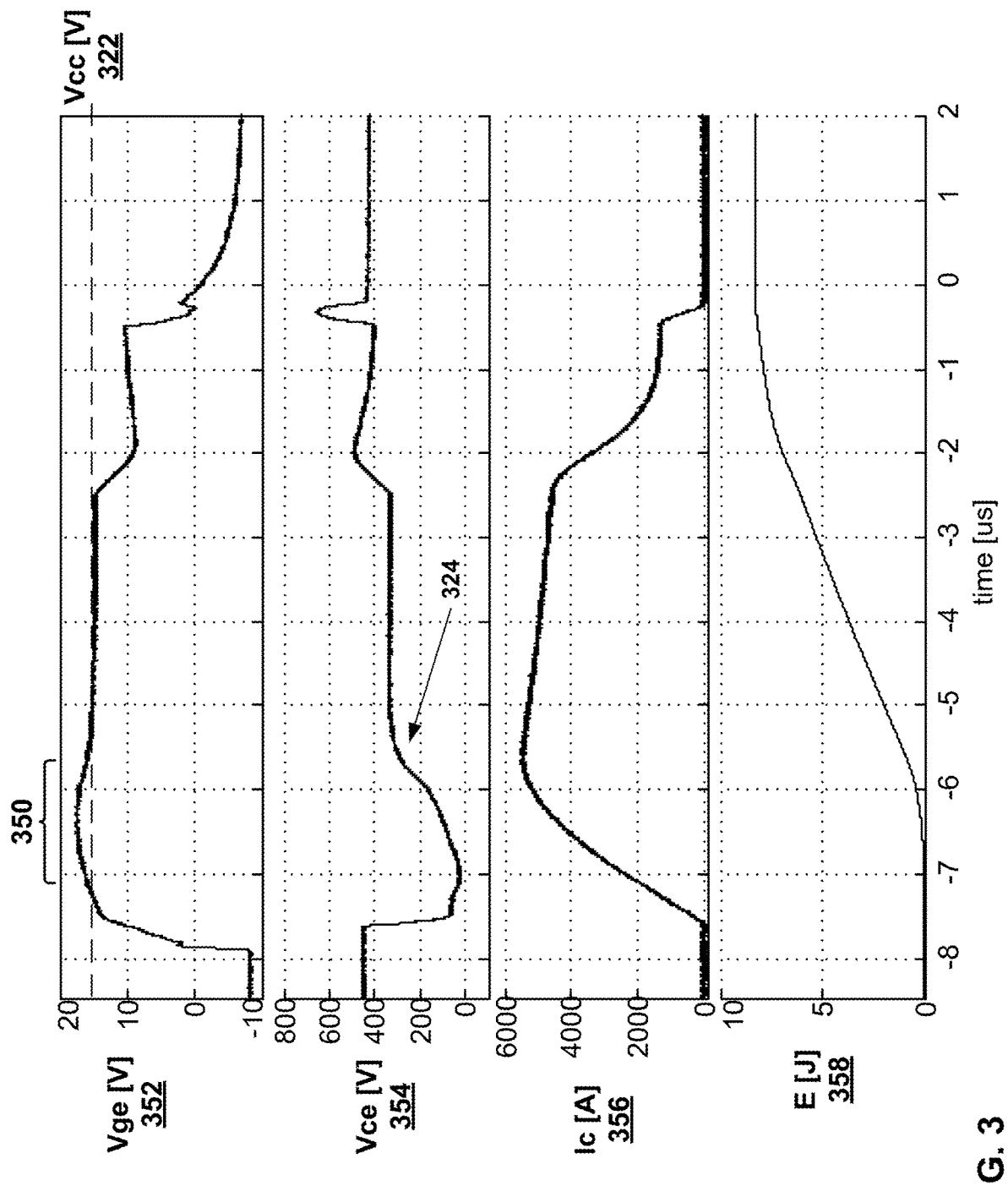
FIG. 3 is a time graph illustrating an example response of circuitry of this disclosure to an overload condition.

FIG. 3 is a time graph illustrating an example response of circuitry of this disclosure to an overload condition. The time graphs of FIG. 3 may depict the operation of systems 100 and 200 described above in relation to FIGS. 1 and 2. To simplify the description, the graphs of FIG. 3 will be described based on the components of system 200 of FIG. 2. At time −8, driver circuit 202 may apply a gate drive signal to transistor 223 via output pin 230 to turn ON transistor 223, which may cause Vce 345 to decrease and the current through transistor 223, Ic 356, to increase.

Empirical measurements indicate that in the example of an overload condition then gate voltage, Vge 352 may overshoot 350 starting at time −7. In some examples, the value of Vge 352 may exceed supply voltage Vcc 322 during overshoot 350. Also, during the overload condition the energy 358 dissipated by power switch circuit 204 may increase over time.

Voltage detection circuit of the protection circuitry, e.g., voltage detection circuitry 16 described above in relation to FIG. 1, may compare Vge 352 to a threshold voltage, such as Vcc 322. The protection circuitry may determine that the overload condition exists based on the overshoot 350 of Vge 352 exceeding the predetermined threshold voltage value. Voltage overshoot 350 may occur only a short time after turning ON transistor 223. Therefore, using voltage overshoot 350 may be a technique to rapidly detect an overload condition in switching circuits with gate-oxide type power switches, when compared to other protection circuit techniques.

At time −6 (324) the overload condition and the current Ic 356 may be high enough the power switch is limiting the amount of current. The voltage across the switch Vce 354 increases and the current Ic 356 decreases. In some examples, e.g., desaturation of an IGBT may result in the voltage, Vce 354, across the device is high though the power switch is turned-on, e.g., Vge 352 is high enough to turn on the power switch. The example of FIG. 3 shows that the power switch may dissipate high energy E 358 within short duration because of the instantaneous high power losses (P=Ic*Vce).

Figure 4:
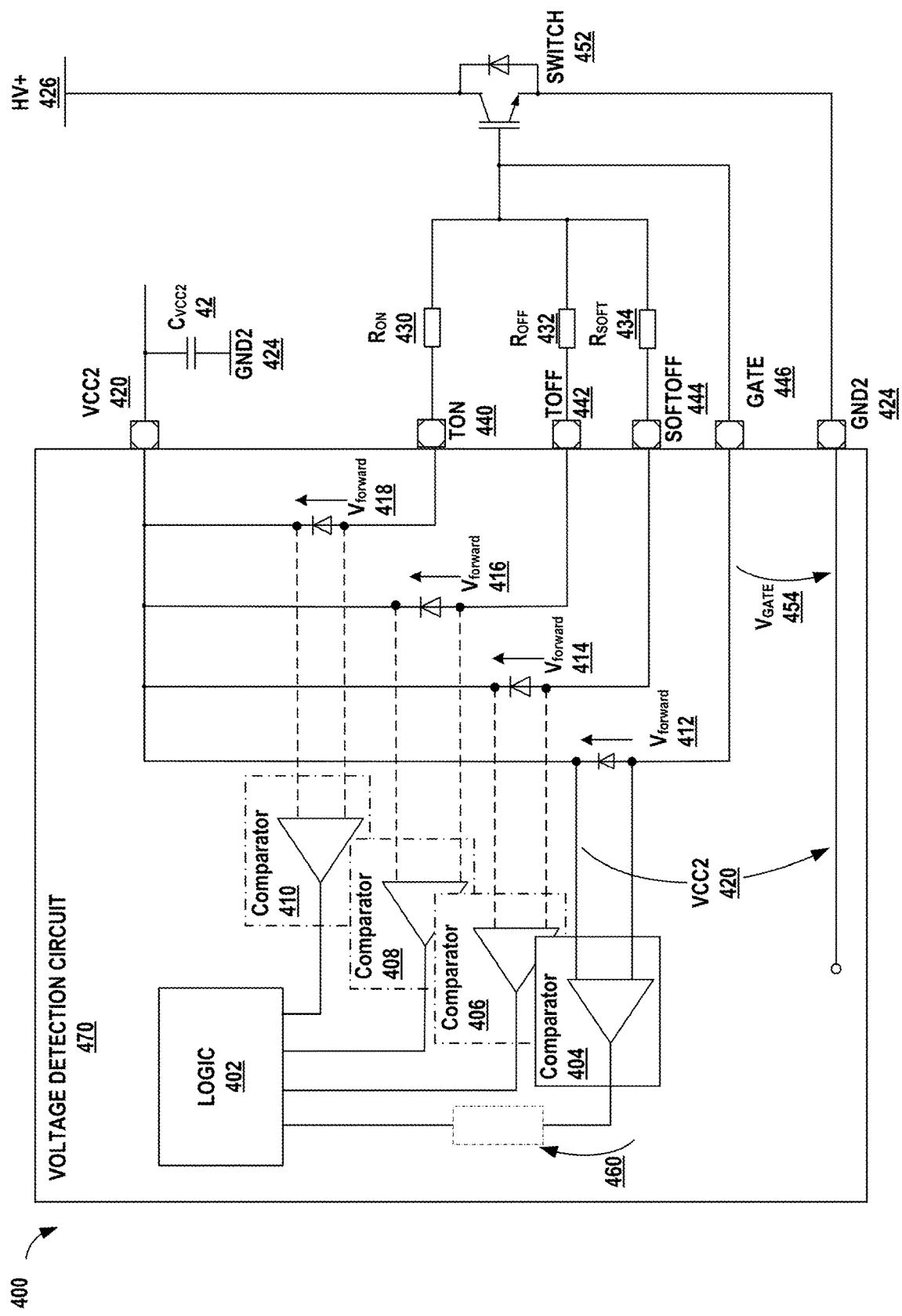
FIG. 4 is a schematic diagram illustrating one possible example implementation of overload detection and response circuitry of this disclosure for a power switching circuit.

FIG. 4 is a schematic diagram illustrating one possible example implementation of overload detection and response circuitry of this disclosure for a power switching circuit. System 400 is an example of systems 100 and 200 described above in relation to FIGS. 1-3 and may have similar functions and characteristics. For example, voltage detection circuit 470 is an example of voltage detection circuitry 16 of FIG. 1, switch 452 is an example of a switch of power switch circuit 104, power switch circuit 204 and transistors 220 and 223.

The arrangement of voltage detection circuit 470 in the example of system 400 compares the voltage across a diode. For example, the input terminals for comparator 404 connects across diode 412 to compare Vgate 454 to the predetermined threshold voltage value of Vcc2 420. When Vgate 454 exceeds Vcc2 420, comparator 404 will indicate to logic 402 that Vgate 454 exceeds the threshold. In other examples, voltage detection circuitry may measure the value of the voltage at the control terminal of switch 452 in a number of other ways. For example, gate pin 446 may connect to an analog to digital (ADC) converter, another type of logic circuit other than a comparator, or other circuitry to detect voltage overshoot.

In the example of FIG. 4, voltage detection circuit 470 includes pins for Vcc2 420, Ton 440, Toff 442, SOFTOFF 444, gate 446 and Gnd2 424. In other examples, a voltage detection circuit may connect to more or fewer pins than shown in the example of FIG. 4. Also, in some examples, voltage detection circuit 470 may include a single comparator 404, or may additionally include one or more of comparators 406, 408 and 410. Voltage detection circuit 470 may be part of a larger circuit, such as system 100 described above in relation to FIG. 1.

Similar to power switch circuit 204 described above in relation to FIG. 2, the collector of switch 452 connects to supply HV+ 426 and the emitter connects to GND2 424. In some examples, a freewheeling diode may connect between the collector and emitter of switch 452. In other examples, switch 452 may be implemented as a power MOSFET or other electronic switch and the body diode may function as a freewheeling diode. The gate of switch 452 connects to Ton 440 through resistor Ron 430, to Toff 442 through resistor Roff 432, to pin SOFTOFF 444 through resistor Rsoft 434 and directly to gate pin 446.

The pin for voltage supply Vcc2 420 connects to ground GND2 424 through off-chip capacitor Cvcc2 42. Vcc2 420 also connects to the cathode of diode 412. The anode of diode 412 connects to gate pin 446. As noted above, the input terminals for comparator 404 connect across diode 412, e.g., the first input terminal connects to the cathode and the second input terminal connects to the anode. Similarly, optional comparators 406, 408 and 410 connect across diodes 414, 416 and 418, respectively. Specifically, a first input terminal of optional comparator 406 connects to the cathode of diode 414 and a second input terminal connects to the anode, a first input terminal of optional comparator 408 connects to the cathode of diode 416 and a second input terminal connects to the anode, a first input terminal of optional comparator 410 connects to the cathode of diode 418 and a second input terminal connects to the anode. The cathodes of diodes 414, 416 and 418 all connect to Vcc2 420. The outputs of each of comparators 404, 406, 408, and 410 connect to logic 402.

In some examples, diodes 412, 414, 416, and 418 may function as electrostatic discharge (ESD) protection diodes. In some examples, to implement the arrangement of FIG. 4, so that diodes 412, 414, 416, and 418 may also function as voltage detection components, diodes with higher current carrying capacity and voltage rating may be preferred over diodes typically used for ESD protection.

In operation, the current path for gate pin 446, where there is no additional resistor between the gate of switch 452 and diode 412 may highest compared to current paths for the other pins. Therefore, comparator 404, connected to diode 412 in the current path with the least resistance may be the preferred comparator to perform the voltage overshoot detection function of this disclosure, as described above. Other comparators connected to the gate of switch 452 through higher impedance current paths may omitted in some examples. In other examples, comparators 406, 408, and 410 as shown in system 400 may be desirable to confirm the signal output by comparator 404, or may be desirable in examples in which voltage detection circuit 470 does not include a gate pin 446 with a direct connection to the gate of switch 452. Also, as described above in relation to FIG. 1, other protection circuits, e.g., DESAT logic 12, OCP 14, SOA, separate from voltage detection circuit 470, may also provide confirmation of a circuit fault that may be detected by the fast voltage overshoot measurement function of voltage detection circuit 470.

In some examples, the output of one or more comparators may connect to a digital or analog signal conditioning circuit (e.g., a glitch detector) to reduce false triggers. In some examples, the digital or analog filtering may be internal to logic 402 (not shown in FIG. 4). In other examples, a filtering circuit 460 may connect to the output of one or more of comparators 404, 406, 408 and/or 410.

Figure 5:
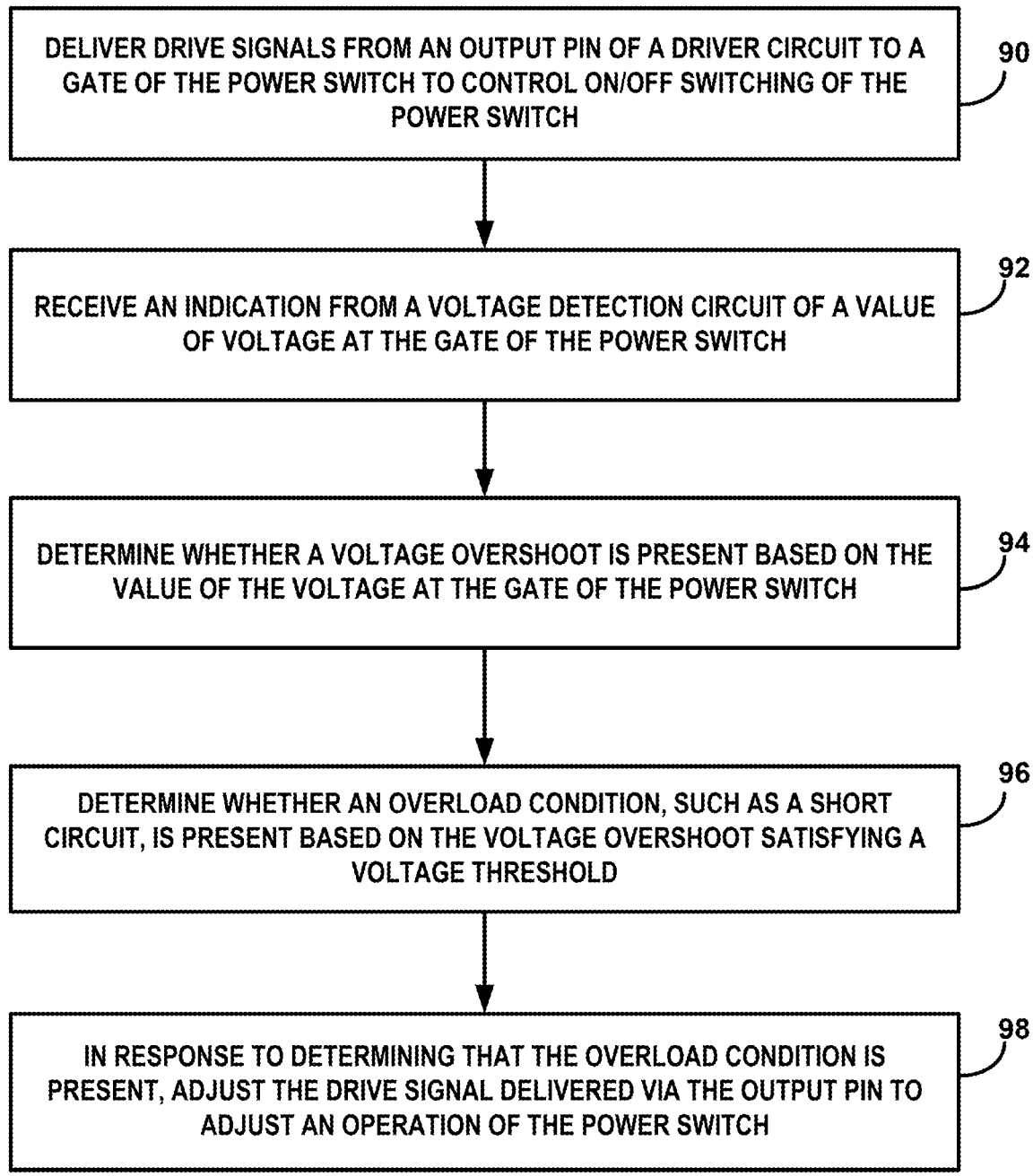
FIG. 5 is a flow chart illustrating an example operation of the overload detection and response circuitry of this disclosure.

FIG. 5 is a flow chart illustrating an example operation of the overload detection and response circuitry of this disclosure. The blocks of FIG. 5 will be described in terms of FIG. 2, unless otherwise noted. FIG. 5 describes an example technique of controlling a power switch.

During normal operation, driver circuit 202 may deliver drive signals from output pins 228 and 230 of driver circuit 202 to the gates of one or more power switches 220 and 223 to control ON/OFF switching of the power switches (90). As described above in relation to FIG. 1, driver circuit 202 may control the average power output by power switch circuit 204 by using one or more pulse modulation schemes.

Driver circuit 202 may receive an indication from the voltage detection circuit of protection circuitry 212 of a value of voltage at the gate of one or more power switches of power switch circuit 204, e.g., via detection pin 216 (92). The voltage detection circuit may determine whether a voltage overshoot is present based on the value of the voltage at the gate of the power switch (94). As described above in relation to FIGS. 1-3, in some examples, an overload condition in a circuit with some types of power switches, such as short circuit, may cause a voltage overshoot at the gate of the power switch.

Circuitry in the protection circuit, driver circuit 202 and or controller 206 may determine whether the voltage overshoot satisfies a voltage threshold to determine whether an overload condition, such as a short circuit is present (96). In some examples, the voltage overshoot that exceeds the supply voltage, e.g., Vcc 222, may provide a good indication of an overload condition in the circuit.

In response to determining that the overload condition is present, driver circuit 202 may adjust the drive signal delivered via the output pin to adjust an operation of power switch circuit 204 (98). As described above in relation to FIG. 2, the determination of the overload and changes to the drive signal may occur based on commands from controller 206, or from within driver circuit 202 without a command from controller 206. In some examples, an arrangement in which driver circuit 202 reacts to the overshoot condition to control the switching circuit may be desirable because such an arrangement may provide faster response and better protection than waiting for communication from an outside controller.

The techniques of this disclosure may also be described in the following examples.

Clause 1: A driver circuit configured to control a power switch, the driver circuit comprises an output pin, wherein the driver circuit is configured to deliver drive signals from the output pin to a control terminal of the power switch to control ON/OFF switching of the power switch; a voltage detection circuit, configured to detect a voltage overshoot on the control terminal of the power switch; and protection logic circuitry configured to: receive an indication from the voltage detection circuit that the voltage overshoot satisfies a voltage threshold; determine, based on the received indication that an overload condition exists; and in response to determining that the overload condition exists, adjust the drive signal delivered via the output pin to change operation of the power switch.

Clause 2: The circuit of clause 1, wherein the indication from the voltage detection circuit that the voltage overshoot satisfies a voltage threshold comprises a first indication; and wherein the control logic is further configured to: receive a second indication from a protection circuit that a fault condition exists at the power switch, wherein the protection circuit is separate from the voltage detection circuit; and in response to receiving the second indication, determine that the overload condition exists.

Clause 3: The circuit of clauses 1 and 2, wherein the protection circuit comprises a desaturation (DESAT) detection circuit or an overcurrent protection (OCP) circuit.

Clause 4: The circuit of any of clauses 1 through 3, wherein the power switch comprises an insulated gate-oxide type power switch, and wherein the control terminal comprises a gate of the insulated gate-oxide type power switch.

Clause 5: The circuit of any of clauses 1 through 4, wherein the power switch comprises a transistor selected from a group consisting of: an insulated gate bipolar transistor (IGBT); a silicon metal oxide semiconductor field effect transistor (MOSFET); a silicon carbide (SiC) MOSFET; or a gallium nitride (GaN) MOSFET.

Clause 6: The circuit of any of clauses 1 through 5, wherein the voltage detection circuit comprises a diode configured to provide electrostatic discharge (ESD) protection.

Clause 7: The circuit of any of clauses 1 through 6, wherein the voltage detection circuit comprises a comparator configured to output the indication that the voltage overshoot satisfies a voltage threshold based on a voltage across the diode.

Clause 8: The circuit of any of clauses 1 through 7, wherein to adjust the drive signal the protection logic circuitry is configured to output a drive signal that shuts off the power switch.

Clause 9: A system comprising a load; a power switch that includes a transistor, wherein the power switch is configured to control power delivered to the load; and a driver circuit configured to control the power switch, the driver circuit includes an output pin, wherein the driver circuit is configured to deliver drive signals from the output pin to a control terminal of the power switch to control ON/OFF switching of the power switch; and a voltage detection circuit, configured to detect a voltage overshoot on the control terminal of the power switch; and protection circuitry, configured to: receive an indication from the voltage detection circuit that the voltage overshoot satisfies a voltage threshold; determine, based on the received indication that an overload condition exists; and in response to determining that the overload condition exists, adjust the drive signal delivered via the output pin to change operation of the power switch.

Clause 10: The system of clause 9, wherein the load is a motor.

Clause 11: The system of any of clauses 9 and 10, further comprising processing circuitry configured to control the operation of the driver circuit.

Clause 12: The system of any of clauses 9 through 11, wherein the indication from the voltage detection circuit that the voltage overshoot satisfies a voltage threshold comprises a first indication; and wherein the control logic is further configured to: receive a second indication from a protection circuit that a fault condition exists at the power switch, wherein the protection circuit is separate from the voltage detection circuit; and in response to receiving the second indication, determine that the overload condition exists.

Clause 13: The system of any of clauses 9 through 12, wherein the protection circuit comprises a desaturation (DESAT) detection circuit or an overcurrent protection (OCP) circuit.

Clause 14: The system of any of clauses 9 through 13, wherein the power switch comprises a transistor selected from a group consisting of: an insulated gate bipolar transistor (IGBT); a silicon metal oxide semiconductor field effect transistor (MOSFET); a silicon carbide (SiC) MOSFET; or a gallium nitride (GaN) MOSFET.

Clause 15: The system of any of clauses 9 through 14, wherein the voltage detection circuit comprises a diode.

Clause 16: The system of any of clauses 9 through 15, wherein the voltage detection circuit comprises a comparator configured to output the indication that the voltage overshoot satisfies a voltage threshold based on a voltage across the diode.

Clause 17: The system of any of clauses 9 through 16, wherein to adjust the drive signal, the protection logic circuitry is configured to output a drive signal that shuts off the power switch.

Clause 18: A method of controlling a power switch includes delivering drive signals from an output pin of a driver circuit to a gate of the power switch to control ON/OFF switching of the power switch; receiving an indication from a voltage detection circuit of a value of voltage at the gate of the power switch; determining whether a voltage overshoot is present based on the value of the voltage at the gate of the power switch; determining whether the voltage overshoot satisfies a voltage threshold; determining whether an overload condition is present based on the voltage overshoot satisfying a voltage threshold; in response to determining that the overload condition is present, adjusting the drive signal delivered via the output pin to adjust an operation of the power switch.

Clause 19: The method of clause 18, wherein the voltage detection circuit comprises a diode, and wherein the voltage detection circuit comprises a comparator configured to output the indication that the voltage overshoot satisfies a voltage threshold based on a voltage across the diode.

Clause 20: The method of clauses 18 and 19, further comprising receiving a second indication from a protection circuit that a fault condition exists at the power switch, wherein the protection circuit is separate from the voltage detection circuit; and determining whether a short circuit condition is present based on both the voltage overshoot satisfying a voltage threshold and based on receiving the second indication.

In one or more examples, the functions described above may be implemented in hardware, software, firmware, or any combination thereof. For example, the various components of FIGS. 1 and 2, such as the protection logic circuitry, the control logic, the controller and so on may be implemented in hardware, software, firmware, or any combination thereof. If implemented in software, the functions may be stored on a tangible computer-readable storage medium and executed by a processor or hardware-based processing unit.

In some examples, one or more aspects of this disclosure may be executed by one or more processors, such as one or more digital signal processors (DSPs), general purpose microprocessors, application specific integrated circuit (ASIC), Field programmable gate array (FPGAs), or other equivalent integrated or discrete logic circuitry. Accordingly, the term "processor," and "processing circuitry" as used herein, such as may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described Various examples of the disclosure have been described. These and other examples are within the scope of the following claims.

What is claimed is:

1. A driver circuit configured to control a power switch, the driver circuit comprising:
   an output pin, wherein the driver circuit is configured to deliver drive signals from the output pin to a control terminal of the power switch to control ON/OFF switching of the power switch;
   a voltage detection circuit, configured to detect a voltage overshoot on the control terminal of the power switch; and
   protection circuitry configured to:
      receive an indication from the voltage detection circuit that the voltage overshoot satisfies a voltage threshold;
      determine, based on the received indication that an overload condition exists; and
      in response to determining that the overload condition exists, adjust the drive signal delivered via the output pin to change operation of the power switch.

2. The driver circuit of claim 1,
   wherein the indication from the voltage detection circuit that the voltage overshoot satisfies a voltage threshold comprises a first indication; and
   wherein the protection circuitry is further configured to:
      receive a second indication from a protection circuit that a fault condition exists at the power switch, wherein the protection circuit is separate from the voltage detection circuit; and
      in response to receiving the second indication, determine that the overload condition exists.

3. The driver circuit of claim 2, wherein the protection circuit comprises a desaturation (DESAT) detection circuit or an overcurrent protection (OCP) circuit.

4. The driver circuit of claim 1,
   wherein the power switch comprises an insulated gate-oxide type power switch, and
   wherein the control terminal comprises a gate of the insulated gate-oxide type power switch.

5. The driver circuit of claim 1, wherein the power switch comprises a transistor selected from a group consisting of:
   an insulated gate bipolar transistor (IGBT);
   a silicon metal oxide semiconductor field effect transistor (MOSFET);
   a silicon carbide (SiC) MOSFET; and
   a gallium nitride (GaN) MOSFET.

6. The driver circuit of claim 1, wherein the voltage detection circuit comprises a diode configured to provide electrostatic discharge (ESD) protection.

7. The driver circuit of claim 6, wherein the voltage detection circuit comprises a comparator configured to output the indication that the voltage overshoot satisfies a voltage threshold based on a voltage across the diode.

8. The driver circuit of claim 1, wherein to adjust the drive signal the protection logic circuitry is configured to output a drive signal that shuts off the power switch.

9. A system comprising:
   a load;
   a power switch that includes a transistor, wherein the power switch is configured to control power delivered to the load; and
   a driver circuit configured to control the power switch, the driver circuit comprising:
      an output pin, wherein the driver circuit is configured to deliver drive signals from the output pin to a control terminal of the power switch to control ON/OFF switching of the power switch; and
      a voltage detection circuit, configured to detect a voltage overshoot on the control terminal of the power switch; and
      protection circuitry, configured to:
         receive an indication from the voltage detection circuit that the voltage overshoot satisfies a voltage threshold;
         determine, based on the received indication that an overload condition exists; and
         in response to determining that the overload condition exists, adjust the drive signal delivered via the output pin to change operation of the power switch.

10. The system of claim 9, wherein the load is a motor.

11. The system of claim 9, further comprising processing circuitry configured to control the operation of the driver circuit.

12. The system of claim 9,
    wherein the indication from the voltage detection circuit that the voltage overshoot satisfies a voltage threshold comprises a first indication; and
    wherein the protection circuitry is further configured to:
       receive a second indication from a protection circuit that a fault condition exists at the power switch, wherein the protection circuit is separate from the voltage detection circuit; and
       in response to receiving the second indication, determine that the overload condition exists.

13. The system of claim 12, wherein the protection circuit comprises a desaturation (DESAT) detection circuit or an overcurrent protection (OCP) circuit.

14. The system of claim 9, wherein the power switch comprises a transistor selected from a group consisting of:
    an insulated gate bipolar transistor (IGBT);
    a silicon metal oxide semiconductor field effect transistor (MOSFET);
    a silicon carbide (SiC) MOSFET; or
    a gallium nitride (GaN) MOSFET.

15. The system of claim 9, wherein the voltage detection circuit comprises a diode.

16. The system of claim 15, wherein the voltage detection circuit comprises a comparator configured to output the indication that the voltage overshoot satisfies a voltage threshold based on a voltage across the diode.

17. The system of claim 9, wherein to change the operation of the switch, the driver circuit is configured to output a drive signal that shuts off the power switch.

18. A method of controlling a power switch, the method comprising:

delivering drive signals from an output pin of a driver circuit to a gate of the power switch to control ON/OFF switching of the power switch;

receiving an indication from a voltage detection circuit of a value of voltage at the gate of the power switch;

determining whether a voltage overshoot is present based on the value of the voltage at the gate of the power switch;

determining whether the voltage overshoot satisfies a voltage threshold;

determining whether an overload condition is present based on the voltage overshoot satisfying a voltage threshold; and in response to determining that the overload condition is present, adjusting the drive signal delivered via the output pin to adjust an operation of the power switch.

19. The method of claim 18, wherein the voltage detection circuit comprises a diode, and wherein the voltage detection circuit comprises a comparator configured to output the indication that the voltage overshoot satisfies a voltage threshold based on a voltage across the diode.

20. The method of claim 18, further comprising:

receiving a second indication from a protection circuit that a fault condition exists at the power switch, wherein the protection circuit is separate from the voltage detection circuit; and determining whether a short circuit condition is present based on both the voltage overshoot satisfying a voltage threshold and based on receiving the second indication.

* * * * *